US008980750B2

(12) United States Patent
Reichardt et al.

(10) Patent No.: US 8,980,750 B2
(45) Date of Patent: Mar. 17, 2015

(54) CHEMICAL MECHANICAL POLISHING (CMP) COMPOSITION COMPRISING A NON-IONIC SURFACTANT AND A CARBONATE SALT

(71) Applicant: BASF SE, Ludwigshafen (DE)

(72) Inventors: Robert Reichardt, Mannheim (DE); Yuzhuo Li; Michael Lauter, Mannheim (DE); Wei Lan William Chiu, Taipei (TW)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/933,427

(22) Filed: Jul. 2, 2013

(65) Prior Publication Data

US 2014/0011361 A1 Jan. 9, 2014

Related U.S. Application Data

(60) Provisional application No. 61/668,468, filed on Jul. 6, 2012.

(51) Int. Cl.
| | |
|---|---|
| *H01L 21/302* | (2006.01) |
| *C09G 1/02* | (2006.01) |
| *H01L 21/306* | (2006.01) |
| *H01L 21/321* | (2006.01) |

(52) U.S. Cl.
CPC ............ *C09G 1/02* (2013.01); *H01L 21/30625* (2013.01); *H01L 21/3212* (2013.01)
USPC ............... 438/693; 216/37; 216/67; 438/689; 438/690; 438/691; 438/692

(58) Field of Classification Search
USPC ............................ 216/37, 67; 438/689–692; 252/79.1–79.4
See application file for complete search history.

(56) References Cited

U.S. PATENT DOCUMENTS 5,141,838 A * 8/1992 Aoshima et al. .............. 430/191
(Continued)

FOREIGN PATENT DOCUMENTS

| CN | 101280158 A | 10/2008 |
|---|---|---|
| CN | 102408837 A | 4/2012 |

(Continued)

OTHER PUBLICATIONS

International Search Report issued Jan. 2, 2014 in PCT/IB2013/055102 filed Jun. 21, 2013.

(Continued)

*Primary Examiner* — Lan Vinh
*Assistant Examiner* — Maki Angadi
(74) *Attorney, Agent, or Firm* — Oblon, McClelland, Maier & Neustadt, L.L.P.

(57) ABSTRACT

A chemical mechanical polishing (CMP) composition (Q) comprising
(A) Inorganic particles, organic particles, or a mixture or composite thereof, wherein the particles are cocoon-shaped
(B) a non-ionic surfactant,
(C) a carbonate or hydrogen carbonate salt,
(D) an alcohol, and
(M) an aqueous medium.

14 Claims, 2 Drawing Sheets

(56) References Cited

U.S. PATENT DOCUMENTS

Figure 1:
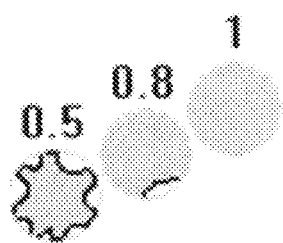

| | | | |
|---|---|---|---|
| 6,544,307 B2 * | 4/2003 | Shimamoto et al. | 51/308 |
| 7,419,911 B2 * | 9/2008 | Chelle et al. | 438/692 |
| 2005/0205837 A1 * | 9/2005 | Miwa | 252/79.1 |
| 2008/0148652 A1 | 6/2008 | Siddiqui et al. | |
| 2008/0242091 A1 | 10/2008 | Kato et al. | |
| 2009/0298290 A1 | 12/2009 | Kamimura | |
| 2009/0311864 A1 | 12/2009 | Yamada et al. | |
| 2012/0058642 A1 | 3/2012 | White et al. | |

FOREIGN PATENT DOCUMENTS

| | | |
|---|---|---|
| JP | 2003-100671 A | 4/2003 |
| WO | WO 2004/063301 A1 | 7/2004 |

OTHER PUBLICATIONS

U.S. Appl. No. 13/935,682, filed Jul. 5, 2013, Reichardt, et al.
European Search Report issued Dec. 5, 2012 in Patent Application No. 12 17 5331.

* cited by examiner

CHEMICAL MECHANICAL POLISHING (CMP) COMPOSITION COMPRISING A NON-IONIC SURFACTANT AND A CARBONATE SALT

FIELD OF THE INVENTION

This invention essentially relates to a chemical mechanical polishing (abbreviated as CMP in the following) CMP composition comprising a non-ionic surfactant and a carbonate or hydrogen carbonate salt.

DESCRIPTION OF THE PRIOR ART

In the semiconductor industry, chemical mechanical polishing is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP compositions comprising a surfactant and/or a carbonate salt are known and described, for instance, in the following references.

JP 2003-100671 A discloses a method of polishing semiconductor wafers using an alkaline aqueous solution which was mixed with a surfactant to the polishing liquid, wherein NaHCO3 and KHCO3 can be added to the solution. The surfactant can be a non-ionic surfactant.

US 2009/0298290 A1 discloses a polishing liquid which is used for chemical mechanical polishing of a body comprising at least (i) a first layer containing polysilicon or modified polysilicon and (ii) a second layer containing at least one selected from the group consisting of silicon oxide, silicon nitride, silicon carbide, silicon carbonitride, silicon oxycarbide, and silicon oxynitride, the polishing liquid having a pH of 1.5 to 7.0, comprising (1) colloidal silica particles, (2) an organic acid, and (3) an anionic surfactant, and being capable of selectively polishing the second layer with respect to the first layer. In order to adjust the pH of the polishing liquid, alkali/acid or a buffer may be used. Examples for a buffering agent include—inter alia—carbonates such as sodium carbonate.

US 2009/311864 A1 discloses a polishing slurry used in chemical mechanical polishing of a barrier layer and an interlayer dielectric film in a semiconductor integrated circuit, the polishing slurry comprising: an abrasive; an oxidizer; an anti-corrosive; an acid; a surfactant; and an inclusion compound, wherein the polishing slurry has a pH of less than 5. An alkali/acid or a buffering agent can be used to adjust the pH. Examples for a buffering agent include—inter alia—carbonates such as sodium carbonate.

OBJECTS OF THE INVENTION

One of the objects of the present invention was to provide a CMP composition and a CMP process appropriate for the chemical-mechanical polishing of substrates used in the semiconductor industry, particularly substrates comprising
(1) copper, and/or
(2) tantalum, tantalum nitride, titanium, titanium nitride, ruthenium, cobalt, or alloys thereof,
and showing an improved polishing performance, especially
(i) a high material removal rate (MRR) of the substrate to be preferably polished, for example tantalum nitride,
(ii) a low material removal rate (MRR) of the substrate not to be preferably polished, for example copper and/or low k material,
(iii) safe handling and reduction of hazardous by-products to a minimum, or
(iv) the combination of (i), (ii), (iii).

Furthermore, the CMP composition should be a stable formulation or dispersion where no phase separation should occur. Moreover, a CMP process was sought that is easy to apply and requires as few steps as possible.

As far as barrier layers and low-k or ultra-low-k materials are present in the semiconductor substrate used, the CMP composition of the invention should preferably remove the barrier layers and maintain the integrity of the low-k and ultra-low-k materials, i.e., it should have a particularly high selectivity of barrier layer over low-k or ultra-low-k materials with regard to the MRRs. Particularly, as far as copper layers, barrier layers and low-k or ultra-low-k materials are present in the substrate to be polished, the CMP composition of the invention should show the combination of as many as possible of the following properties: (a) high MRR of barrier layer, (b) low MRR of copper layer, (c) low MRR of low-k or ultra-low-k materials, (d) high selectivity of barrier layer over copper layer with regard to MRR, (e) high selectivity of barrier layer over low-k and ultra-low-k materials with regard to MRR. Most particularly, as far as copper layers, tantalum or tantalum nitride layers and low-k or ultra-low-k materials are present in the substrate to be polished, the CMP composition of the invention should show the combination of as many as possible of the following properties: (a') high MRR of tantalum or tantalum nitride, (b') low MRR of copper layer, (c') low MRR of low-k or ultra-low-k materials, (d') high selectivity of tantalum or tantalum nitride over copper with regard to MRR, and (e') high selectivity of tantalum nitride over low-k or ultra-low-k materials with regard to MRR. Furthermore, the CMP composition of the invention should show a long shelf life, while high MRR of barrier layer is maintained.

SUMMARY OF THE INVENTION

Accordingly, a chemical mechanical polishing (CMP) composition (Q) was found which comprises
(A) inorganic particles, organic particles, or a mixture or composite thereof, wherein the particles are cocoon-shaped,
(B) a non-ionic surfactant,
(C) a carbonate or hydrogen carbonate salt,
(D) an alcohol, and
(M) an aqueous medium.

In addition, a process for the manufacture of a semiconductor device comprising the chemical-mechanical polishing of a substrate in the presence of the CMP composition (Q) was found, which fulfills the objects of the invention.

Moreover, the use of the CMP composition (Q) for polishing substrates which are used in the semiconductor industry has been found, which fulfills the objects of the invention.

Preferred embodiments are explained in the claims and the specification. It is understood that combinations of preferred embodiments are within the scope of the present invention.

A process for the manufacture of semiconductor devices comprising the chemical mechanical polishing of a substrate in the presence of the CMP composition (Q) was found. A further process of the invention is a process for chemical mechanical polishing of a substrate (S) used in the semiconductor industry in the presence of the CMP composition (Q). The CMP composition (Q) is used for chemical-mechanical polishing of a substrate (S) used in the semiconductor industry. Said substrate (S) is preferably a substrate comprising
(i) copper, and/or
(ii) tantalum, tantalum nitride, titanium, titanium nitride, ruthenium, cobalt, or alloys thereof.

Said substrate (S) is more preferably a substrate comprising
(i) copper, and
(ii) tantalum, tantalum nitride, titanium, titanium nitride, ruthenium, cobalt, or alloys thereof, and
(iii) a low k material.

Said substrate (S) is most preferably a substrate comprising
(i) copper, and
(ii) tantalum, or tantalum nitride, and
(iii) a low k material.

A low-k material is a material having a k value (dielectric constant) of less than 3.5, preferably less than 3.0, more preferably less than 2.7. An ultra-low-k material is a material having a k value (dielectric constant) of less than 2.4.

The CMP composition (Q) comprises the components (A), (B), (C), (D), (M) and optionally further components as described below.

The CMP composition (Q) comprises inorganic particles, organic particles, or a mixture or composite thereof, wherein the particles are cocoon-shaped (A).

(A) can be
of one type of cocoon-shaped inorganic particles,
a mixture or composite of different types of cocoon-shaped inorganic particles,
of one type of cocoon-shaped organic particles,
a mixture or composite of different types of cocoon-shaped organic particles, or
a mixture or composite of one or more types of cocoon-shaped inorganic particles and one or more types of cocoon-shaped organic particles.

A composite is a composite cocoon-shaped particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the cocoon-shaped particles (A) can be contained in varying amounts in the CMP composition (Q). Preferably, the amount of (A) is not more than 10 wt. % (wt. % stands for "percent by weight"), more preferably not more than 7 wt. %, most preferably not more than 5 wt. %, particularly not more than 3 wt. %, for example not more than 2.2 wt. %, based on the total weight of the composition (Q). Preferably, the amount of (A) is at least 0.002 wt. %, more preferably at least 0.01 wt. %, most preferably at least 0.08 wt. %, particularly at least 0.5 wt. %, for example at least 1 wt. %, based on the total weight of the composition (Q).

Generally, the cocoon-shaped particles (A) can be contained in varying particle size distributions. The particle size distributions of the cocoon-shaped particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the cocoon-shaped particles (A) can vary within a wide range. The mean particle size is the $d_{50}$ value of the particle size distribution of (A) in the aqueous medium (M) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the cocoon-shaped particles (A) is in the range of from 5 to 500 nm, more preferably in the range of from 10 to 400 nm, most preferably in the range of from 20 to 300 nm, in particular in the range of from 30 to 160 nm, for example in the range of from 35 to 135 nm, as measured with dynamic light scattering techniques using instruments such as High Performance Particle Sizer (HPPS) from Malvern Instruments, Ltd. or Horiba LB550.

According to the invention the particles (A) are cocoon-shaped. The cocoons may be with or without protrusions or indentations Cocoon-shaped particles are particles with a minor axis of from 10 to 200 nm, a ratio of major/minor axis of 1.4 to 2.2, more preferably of 1.6 to 2.0. Preferably they have an averaged shape factor of from 0.7 to 0.97, more preferably of from 0.77 to 0.92, preferably an averaged sphericity of from 0.4 to 0.9, more preferably of from 0.5 to 0.7 and preferably an averaged equivalent circle diameter of from 41 to 66 nm, more preferably of from 48 to 60 nm, which can be determined by scanning electron microscopy.

The averaged shape factor gives information on the sphericity and the indentations of a particle (FIG. 1) and can be calculated according to the following formula:

$$\text{shape factor} = 4\pi(\text{area}/\text{perimeter}^2)$$

The averaged sphericity gives information on the elongation of a particle using the moment about the mean (FIG. 2) and can be calculated according to the following formula wherein M are the centers of gravity of the respective particles:

$$\text{sphericity} = (M_{xx} - M_{yy}) - [4M_{xy}^2 + (M_{yy} - M_{xx})^2]^{0.5}/(M_{xx} - M_{yy}) + [4M_{xy}^2 + (M_{yy} - M_{xx})^2]^{0.5}$$

$$\text{elongation} = (1/\text{sphericity})^{0.5}$$

Figure 3:
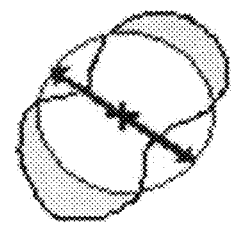

The equivalent circle diameter (also abbreviated as ECD in the following) gives information on the diameter of a circle which has the same area as the non-circular particle (FIG. 3).

The average shape factor, average sphericity and average ECD are the arithmetic averages of the respective property related to the analyzed number of particles.

Figure 4:
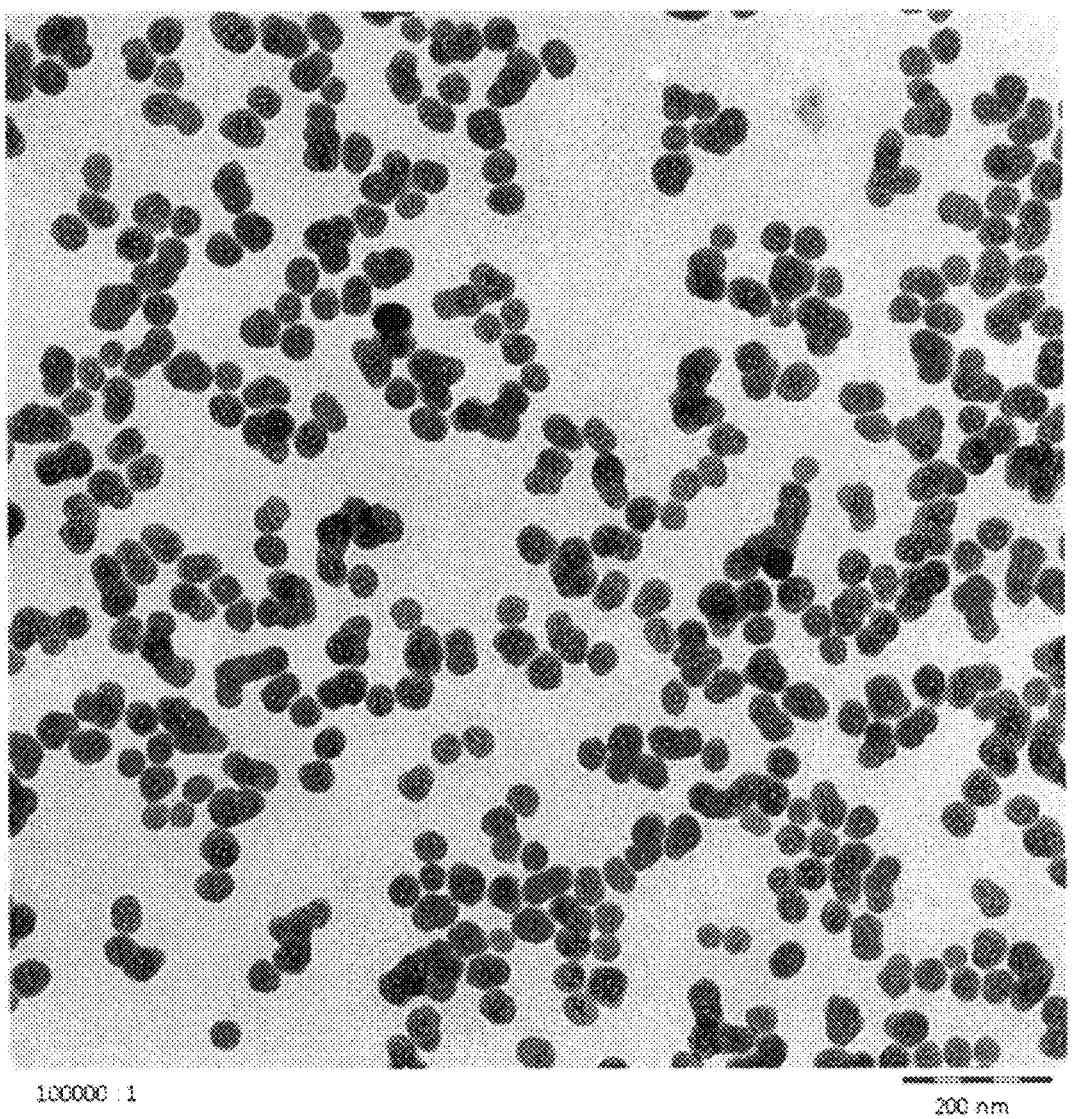

For example, cocoon-shaped particles are FUSO PL-3 manufactured by Fuso Chemical Corporation having an average primary particle size (d1) of 35 nm and an average secondary particle size (d2) of 70 nm (FIG. 4).

The chemical nature of the cocoon-shaped particles (A) is not particularly limited. (A) may be of the same chemical nature or a mixture or composite of particles of different chemical nature. As a rule, cocoon-shaped particles (A) of the same chemical nature are preferred.

Generally, (A) can be
cocoon-shaped inorganic particles such as a metal, a metal oxide or carbide, including a metalloid, a metalloid oxide or carbide, or
cocoon-shaped organic particles such as polymer particles,
a mixture or composite of cocoon-shaped inorganic and cocoon-shaped organic particles.

The cocoon-shaped particles (A) are
preferably inorganic particles, or a mixture or composite thereof,
more preferably oxides and carbides of metals or metalloids, or a mixture or composite thereof,
most preferably alumina, ceria, copper oxide, iron oxide, nickel oxide, manganese oxide, silica, silicon nitride, silicon carbide, tin oxide, titania, titanium carbide, tungsten oxide, yttrium oxide, zirconia, or a mixture or composites thereof,
particularly preferably alumina, ceria, silica, titania, zirconia, or a mixture or composite thereof,
in particular silica particles,
for example colloidal silica particles.

Typically, colloidal silica particles are produced by a wet precipitation process.

In another embodiment in which (A) are cocoon-shaped organic particles, or a mixture or composite of cocoon-shaped inorganic and cocoon-shaped organic particles, polymer particles are preferred as cocoon-shaped organic particles.

According to the invention cocoon-shaped inorganic particles are preferred. Most preferably the particles (A) are cocoon-shaped silica particles.

According to the invention, the CMP composition (Q) comprises a non-ionic surfactant (B). Generally, a surfactant used in a CMP composition is a surface-active compound which decreases the surface tension of a liquid, the interfacial tension between two liquids, or that between a liquid and a solid. In general, any non-ionic surfactant (B) can be used.

The non-ionic surfactant (B) is preferably water-soluble and/or water-dispersible, more preferably water-soluble. "Water-soluble" means that the relevant component or ingredient of the composition of the invention can be dissolved in the aqueous phase on the molecular level. "Water-dispersible" means that the relevant component or ingredient of the composition of the invention can be dispersed in the aqueous phase and forms a stable emulsion or suspension.

The non-ionic surfactant (B) is preferably an amphiphilic non-ionic surfactant, i.e. a surfactant which comprises at least one hydrophobic group (b1) and at least one hydrophilic group (b2). This means that the nonionic surfactant (B) can comprise more than one hydrophobic group (b1), e.g., 2, 3 or more groups (b1), which are separated from each other by at least one hydrophilic group (b2) as hereinbelow described. This also means that the nonionic surfactant (B) can comprise more than one hydrophilic group (b2), e.g., 2, 3 or more groups (b2) which are separated from each other by hydrophobic groups (b1) as hereinbelow described.

Therefore, the nonionic surfactant (B) can have different blocklike general structures. Examples of such general block-like structures are:
b1-b2,
b1-b2-b1,
b2-b1-b2,
b2-b1-b2-b1,
b1-b2-b1-b2-b1, and
b2-b1-b2-b1-b2.

The non-ionic surfactant (B) is more preferably an amphiphilic non-ionic surfactant comprising a polyoxyalkylene group.

The hydrophobic group (b1) is preferably an alkyl group, more preferably an alkyl group having 4 to 40, most preferably 5 to 20, particularly preferably 7 to 18, in particular 10 to 16, for example 11 to 14 carbon atoms.

The hydrophilic group (b2) is preferably a polyoxyalkylene group. Said polyoxyalkylene groups can be oligomeric or polymeric. More preferably, the hydrophilic group (b2) is a hydrophilic group selected from the group consisting of polyoxyalkylene groups comprising (b21) oxyalkylene monomer units, and
(b22) oxyalkylene monomer units other than oxyethylene monomer units, said monomer units (b21) being not identical to monomer units (b22), and said polyoxyalkylene group of (b2) containing the monomer units (b21) and (b22) in random, alternating, gradient and/or block-like distribution.

Most preferably, the hydrophilic group (b2) is a hydrophilic group selected from the group consisting of polyoxyalkylene groups comprising
(b21) oxyethylene monomer units, and
(b22) oxyalkylene monomer units other than oxyethylene monomer units,
said polyoxyalkylene group of (b2) containing the monomer units (b21) and (b22) in random, alternating, gradient and/or block-like distribution.

Preferably, the oxyalkylene monomer units other than oxyethylene monomer units (b22) are substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups. The oxyalkylene monomer units other than oxyethylene monomer units (b22) are
more preferably derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups,
most preferably derived from alkyl-substituted oxiranes (X),
particularly preferably derived from substituted oxiranes (X) wherein the substituents are selected from the group consisting of alkyl groups having 1 to 10 carbon atoms,
for example derived from methyl oxirane (propyleneoxide) and/or ethyl oxirane (butylene oxide).

The substituents of the substituted oxiranes (X) themselves can also carry inert substituents, i.e., substituents which do not adversely affect the copolymerization of the oxiranes (X) and the surface activity of the non-ionic surfactants (B). Examples of such inert substituents are fluorine and chlorine atoms, nitro groups and nitrile groups. If such inert substituents are present, they are used in such amounts that they do not adversely affect the hydrophilic-hydrophobic balance of the non-ionic surfactant (B). Preferably, the substituents of the substituted oxiranes (X) do not carry such inert substituents.

The substituents of the substituted oxiranes (X) are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-arylgroup 11 to 20 carbon atoms, and alkyl-cycloalkyl-aryl groups having 12 to 30 carbon atoms. Most preferably, the substituents of the substituted oxiranes (X) are selected from the group consisting of alkyl groups having 1 to 10 carbon atoms. Particularly, the substituents of the substituted oxiranes (X) are selected from the group consisting of alkyl groups having 1 to 6 carbon atoms.

Examples for the most preferred substituted oxiranes (X) are methyl oxirane (propyleneoxide) and/or ethyl oxirane (butylene oxide), particularly methyl oxirane.

Most preferably, the hydrophilic group (b2) consists of the monomer units (b21) and (b22).

In another embodiment, the hydrophilic group (b2) is preferably a polyoxyethylene, polyoxypropylene or polyoxybutylene group, more preferably a polyoxyethylene group.

In the embodiments where the hydrophilic group (b2) comprises or consists of the monomer units (b21) and (b22), the polyoxyalkylene group—acting as hydrophilic group (b2)—contains the monomer units (b21) and (b22) in random, alternating, gradient and/or blocklike distribution. This means, that one hydrophilic group (b2) can have only one type of distribution, i.e., random: . . . -b21-b21-b22-b21-b22-b22-b22-b21-b22- . . . ;
alternating: . . . -b21-b22-b21-b22-b21- . . . ;
gradient: . . . b21-b21-b21-b22-b21-b21-b22-b22-b21-b22-b22-b22- . . . ; or
blocklike: . . . -b21-b21-b21-b21-b22-b22-b22-b22- . . . .

Alternatively, the hydrophilic group (b2) can also contain at least two types of distributions, e.g., an oligomeric or polymeric segment having a random distribution and an oligomeric or polymeric segment having alternating distribution. Most preferably, the hydrophilic group (b2) preferably has only one type of distribution, and most preferably, said distribution is random or blocklike.

In the embodiments where the hydrophilic group (b2) comprises or consists of the monomer units (b21) and (b22), the molar ratio of (b21) to (b22) can vary broadly and, therefore, can be adjusted most advantageously to the particular requirements of the composition, the process and the use of the invention. Preferably the molar ratio (b21):(b22) is from 100:1 to 1:1, more preferably, from 60:1 to 1.5:1 and, most preferably, from 50:1 to 1.5:1, and particularly preferably, from 25:1 to 1.5:1, and particularly, from 15:1 to 2:1, and for example, from 9:1 to 2:1.

Also the degree of polymerization of the oligomeric and polymeric polyoxyalkylene groups—acting as hydrophilic groups (b2)—can vary broadly and, therefore, can be adjusted most advantageously to the particular requirements of the composition, the process and the use of the invention. Preferably, the degree of polymerization is in the range of from 5 to 100, preferably 5 to 90, and most preferably, 5 to 80.

Particularly, the non-ionic surfactant (B) is an amphiphilic non-ionic polyoxyethylene-polyoxypropylene alkyl ether surfactant which is a mixture of molecules containing, on the average, an alkyl group having 10 to 16 carbon atoms and 5 to 20 oxyethylene monomer units (b21) and 2 to 8 oxypropylene monomer units in random distribution. For example, the non-ionic surfactant (B) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution.

The non-ionic surfactant (B) can be contained in varying amounts in the CMP composition (Q). Preferably, the amount of (B) is not more than 10 wt. %, more preferably not more than 3 wt. %, most preferably not more than 1 wt. %, particularly preferably not more than 0.5 wt. %, particularly not more than 0.1 wt. %, for example not more than 0.05 wt. %, based on the total weight of the composition (Q). Preferably, the amount of (B) is at least 0.00001 wt. %, more preferably at least 0.0001 wt. %, most preferably at least 0.0008 wt. %, particularly preferably at least 0.002 wt. %, particularly at least 0.005 wt. %, for example at least 0.008 wt. %, based on the total weight of the composition (Q).

Generally, the non-ionic surfactant (B) can have different weight average molecular weights. The weight average molecular weight of (B) is preferably at least 300, more preferably at least 500, most preferably at least 700, particularly at least 800, for example at least 900. The weight average molecular weight of (B) is preferably not more than 15,000, more preferably not more than 6,000, most preferably not more than 3,000, particularly not more than 2,000, for example not more than 1,400 [g/mol], as determined by gel permeation chromatography (abbreviated as "GPC" in the following). In particular, the weight average molecular weight of (B) is from 900 to 1,400 [g/mol] as determined by GPC. Said GPC are standard GPC techniques known to the person skilled of the art.

In general, the solubility of non-ionic surfactant (B) in an aqueous medium can vary within a wide range. The solubility of (B) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

According to the invention, the CMP composition (Q) comprises a carbonate or hydrogen carbonate salt (C). In general, a carbonate salt is any salt comprising at least one $CO_3^{2-}$ anion, and a hydrogen carbonate salt is any salt comprising at least one $HCO_3^-$ anion.

Preferably, the carbonate or hydrogen carbonate salt (C) does not comprise any anions other than $CO_3^{2-}$ or $HCO_3^-$ anion.

Preferably, the carbonate or hydrogen carbonate salt (C) is a carbonate salt. Most preferably, (C) is a carbonate salt which does not comprises any anions other than the $CO_3^{2-}$ anion.

Preferably, the carbonate or hydrogen carbonate salt (C) comprises at least one cation selected from the group consisting of $NH_4^+$ cation, organic ammonium cations, N-heterocyclic cations, alkali metal, and earth alkali metal cation. More preferably, (C) comprises at least one $NH_4^+$ alkali metal or earth alkali metal cation. Most preferably, (C) comprises at least one alkali metal cation. Particularly preferably, (C) is an alkali carbonate or an alkali hydrogen carbonate. Particularly more preferably, (C) comprises at least one sodium or potassium cation. Particularly most preferably, (C) comprises at least one potassium cation. Particularly, (C) is potassium carbonate or potassium hydrogen carbonate. For example, (C) is potassium carbonate.

An organic ammonium cation is any cation of the formula $[NR^{11}R^{12}R^{13}R^{14}]^+$, wherein $R^{11}$, $R^{12}$, $R^{13}$ is—independently from each other—H, alkyl, aryl, alkylaryl, or arylalkyl, $R^{14}$ is alkyl, aryl, alkylaryl, or arylalkyl.

The carbonate or hydrogen carbonate salt (C) can be contained in varying amounts in the CMP composition (Q). Preferably, the amount of (C) is not more than 10 wt. %, more preferably not more than 5 wt. %, most preferably not more than 3 wt. %, particularly preferably not more than 2 wt. %, particularly not more than 1 wt. %, for example not more than 0.7 wt. %, based on the total weight of the composition (Q). Preferably, the amount of (C) is at least 0.001 wt. %, more preferably at least 0.01 wt. %, most preferably at least 0.05 wt. %, particularly preferably at least 0.1 wt. %, particularly at least 0.2 wt. %, for example at least 0.4 wt. %, based on the total weight of the composition (Q).

According to the invention, the CMP composition (Q) comprises an alcohol (D). In general, any alcohol can be used as (D).

The alcohol (D) is preferably an alcohol having at least two hydroxyl groups which are not dissociable in the aqueous medium. More preferably (D) is an alcohol having two hydroxyl groups which are not dissociable in the aqueous medium. "Not dissociable" means that the $pK_a$ value (logarithmic measure of the acid dissociation constant) for the reaction alcohol (D)→deprotonated alcohol (D)+H+
of the hydroxyl group in the neutral aqueous phase is more than 9.9, more preferably more than 11, most preferably more than 12, particularly preferably more than 13, for example more than 14 as measured in de-ionized water at 25° C. and atmospheric pressure. For example, propane-1,2-diol (alpha-propylene glycol) has a $pK_a$ value of 14.9 as measured in de-ionized water at 25° C. and atmospheric pressure.

More preferably, the alcohol (D) is a diol, triol, tetraol, pentaol, hexaol, heptaol, octaol, nonaol, decaol, or a polyol. Most preferably, (D) is a diol, triol, tetraol, pentaol, or hexaol. Particularly preferably, (D) is a diol. Particularly most preferably, (D) is ethanediol (ethylene glycol), propanediol (propylene glycol), or butanediol (butylene glycol). Particularly, (D) is propanediol (propylene glycol). For example, (D) is propane-1,2-diol (alpha-propylene glycol).

The alcohol (D) is preferably an alcohol having 2 to 50 carbon atoms, more preferably an alcohol having 2 to 20 carbon atoms, most preferably an alcohol having 2 to 11 carbon atoms, particularly preferably an alcohol having 2 to 7 carbon atoms, in particular an alcohol having 2 to 4 carbon atoms, for example an alcohol having 3 carbon atoms.

The alcohol (D) can be contained in varying amounts in the CMP composition (Q). Preferably, the amount of (D) is not more than 10 wt. %, more preferably not more than 5 wt. %, most preferably not more than 3 wt. %, particularly preferably not more than 2 wt. %, particularly not more than 1.2 wt. %, for example not more than 0.8 wt. %, based on the total weight of the composition (Q). Preferably, the amount of (D) is at least 0.001 wt. %, more preferably at least 0.01 wt. %, most preferably at least 0.05 wt. %, particularly preferably at least 0.1 wt. %, particularly at least 0.3 wt. %, for example at least 0.5 wt. %, based on the total weight of the composition (Q).

In general, the solubility of alcohol (D) in an aqueous medium can vary within a wide range. The solubility of (D) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

According to the invention, the CMP composition (Q) contains an aqueous medium (M). (M) can be of one type or a mixture of different types of aqueous media.

In general, the aqueous medium (M) can be any medium which contains water. Preferably, the aqueous medium (M) is a mixture of water and an organic solvent miscible with water (e.g. an alcohol, preferably a $C_1$ to $C_3$ alcohol, or an alkylene glycol derivative). More preferably, the aqueous medium (M) is water. Most preferably, aqueous medium (M) is de-ionized water.

If the amounts of the components other than (M) are in total y % by weight of the CMP composition, then the amount of (M) is (100−y) % by weight of the CMP composition.

The aqueous medium (M) can be contained in varying amounts in the CMP composition (Q). Preferably, the amount of (M) is not more than 99.9 wt. %, more preferably not more than 99.6 wt. %, most preferably not more than 99 wt. %, particularly preferably not more than 98 wt. %, particularly not more than 97 wt. %, for example not more than 95 wt. %, based on the total weight of the composition (Q). Preferably, the amount of (M) is at least 60 wt. %, more preferably at least 70 wt. %, most preferably at least 80 wt. %, particularly preferably at least 85 wt. %, particularly at least 90 wt. %, for example at least 93 wt. %, based on the total weight of the composition (Q).

The CMP composition (Q) can further optionally comprise at least one type of oxidizing agent (E), preferably one to two types of oxidizing agent (E), more preferably one type of oxidizing agent (E). The oxidizing agent (E) is different from the components (A), (B), (C), (D) and (M). In general, the oxidizing agent is a compound which is capable of oxidizing the to-be-polished substrate or one of its layers. Preferably, (E) is a per-type oxidizer. More preferably, (E) is a peroxide, persulfate, perchlorate, perbromate, periodate, permanganate, or a derivative thereof. Most preferably, (E) is a peroxide or persulfate. Particularly, (E) is a peroxide. For example, (E) is hydrogen peroxide.

If present, the oxidizing agent (E) can be contained in varying amounts in the CMP composition (Q). Preferably, the amount of (E) is not more than 20 wt. %, more preferably not more than 10 wt. %, most preferably not more than 5 wt. %, particularly not more than 2.5 wt. %, for example not more than 1.5 wt. %, based on the total weight of the composition (Q). Preferably, the amount of (E) is at least 0.01 wt. %, more preferably at least 0.08 wt. %, most preferably at least 0.4 wt. %, particularly at least 0.75 wt. %, for example at least 1 wt. %, based on the total weight of the composition (Q). If hydrogen peroxide is used as oxidizing agent (E), the amount of (E) is preferably 0.5 wt. % to 4 wt. %, more preferably 1 wt. % to 2 wt. %, for instance 1.2 to 1.3 wt. %, based on the total weight of the composition (Q).

The CMP composition (Q) can further optionally contain at least one corrosion inhibitor (F), for example one corrosion inhibitor. The corrosion inhibitor (F) is different from the components (A), (B), (C), (D) and (M). In general, all compounds forming a protective molecular layer on the surface of a metal—for example copper—can be used as corrosion inhibitor. Preferred corrosion inhibitors (F) are thiols, film forming polymers, polyols, diazoles, triazoles, tetrazoles, and their derivatives, most preferably imidazole, 1,2,4-triazole, benzotriazole, tolyltriazole, and derivatives thereof, for example benzotriazole.

If present, the corrosion inhibitor (F) can be contained in varying amounts. If present, the amount of (F) is preferably not more than 10 wt. %, more preferably not more than 2 wt. %, most preferably not more than 0.5 wt. %, particularly not more than 0.15 wt. %, for example not more than 0.08 wt. %, based on the total weight of the corresponding composition. If present, the amount of (F) is preferably at least 0.0001 wt. %, more preferably at least 0.001 wt. %, most preferably at least 0.005 wt. %, particularly at least 0.02 wt. %, for example at least 0.04 wt. %, based on the total weight of the corresponding composition (Q).

The CMP composition (Q) can further optionally contain at least one chelating agent (G), preferably one chelating agent (G). In general, a chelating agent used in a CMP composition is a chemical compound that forms soluble, complex molecules with certain metal ions, inactivating the ions so that they cannot normally react with other elements or ions to produce precipitates or scale. The chelating agent (G) is different from the components (A), (B), (C), (D) and (M).

If present, the chelating agent (G) can be contained in varying amounts. If present, the amount of (G) is preferably not more than 10 wt. %, more preferably not more than 5 wt. %, most preferably not more than 3 wt. %, particularly not more than 2 wt. %, for example not more than 1.5 wt. %, based on the total weight of the corresponding composition. If present, the amount of (G) is preferably at least 0.001 wt. %, more preferably at least 0.01 wt. %, most preferably at least 0.07 wt. %, particularly at least 0.2 wt. %, for example at least 0.7 wt. %, based on the total weight of the corresponding composition (Q).

Preferably, the chelating agent (G) is an inorganic or organic acid. More preferably, the chelating agent (G) is a compound comprising at least two carboxylic acid (—COOH) or carboxylate (—COO⁻) groups. Most preferably, the chelating agent (G) is selected from the group consisting of malonic acid, citric acid, acetic acid, adipic acid, butyric acid, glutaric acid, glycolic acid, formic acid, fumaric acid, lactic acid, lauric acid, malic acid, maleic acid, myristic acid, oxalic acid, palmitic acid, propionic acid, pyruvic acid, stearic acid, succinic acid, tartaric acid, valeric acid, 2-methylburyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, propane-1,2,3-tricarboxylic acid, butane-1,2,3,4-tetracarboxylic acid, pentane-1,2,3,4,5-pentacarboxylic acid, trimellitic acid, trimesinic acid, pyromellitic acid, mellitic acid, an oligomeric or polymeric polycarboxylic acid, and an aromatic compound comprising an acid group (Y). Particularly preferably, (G) is selected from the group consisting of malonic acid, citric acid, adipic acid, propane-1,2,3-tricarboxylic acid, butane-1,2,3,4-tetracarboxylic acid, pentane-1,2,3,4,5-pentacarboxylic acid, and an aromatic compound comprising an acid group (Y). Particularly most preferably, (G) is selected from the group consisting of malonic acid, citric acid, and an aromatic compound comprising an acid group (Y). Particularly, (G) is an aromatic compound comprising an acid group (Y). Said aromatic compound comprising an acid group (Y) is referred to as (G11) in the following. For example, (G) is a benzenecarboxylic acid comprising at least two carboxylic acid (—COOH) groups, or a salt thereof. For instance, (G) is a benzenedicarboxylic acid.

The acid group (Y) is defined as being (Y) as such and its deprotonated form. The acid group (Y) comprised in aromatic compound (G11) is preferably any acid group so that the $pK_a$ value (logarithmic measure of the acid dissociation constant) of
the reaction H-(G11)⇌(G11)⁻+H⁺ or
the reaction [H-(G11)]⁺⇌(G11)+H⁺
is not more than 7, more preferably not more than 6, most preferably not more than 5.5, particularly preferably not more than 5, as measured in de-ionized water at 25° C. and atmospheric pressure.

The acid group (Y) comprised in aromatic compound (G11) is preferably a carboxylic acid (—COOH), a carbonic acid (—O—COOH), a sulfonic acid (—SO₃H), a sulfuric acid (—O—SO₃H), a phosphonate (—P(=O)(OH)(OR¹)), a phosphate (—O—P(=O)(OH)(OR²)), a phosphonic acid (—P(=O)(OH)₂), a phosphoric acid (—O—P(=O)(OH)₂) moiety, or their deprotonated forms, wherein R¹ is alkyl, aryl, alkylaryl, or arylalkyl, and R² is alkyl, aryl, alkylaryl, or arylalkyl. More preferably, said acid group (Y) is a carboxylic acid (—COOH), or a sulfonic acid (—SO₃H) moiety, or their deprotonated forms. Most preferably, said acid group (Y) is a carboxylic acid (—COOH) moiety, or its deprotonated form.

Preferably, the acid group (Y) is directly covalently bound to the aromatic ring system of the aromatic compound (G11).

The aromatic compound (G11) comprises preferably at least one, more preferably 1 to 2, most preferably exactly one further functional group (Z) which is different from the acid group (Y). The further functional group (Z) can be any functional group other than the acid group (Y), and is
preferably an ester (—COOR³), hydroxyl, alkoxy, alkyl, aryl, alkylaryl, arylalkyl, nitro, amino, thio, or halogen moiety,
more preferably an ester (—COOR³), hydroxyl, alkoxy, nitro, amino, thio, or halogen moiety,
most preferably an ester (—COOR³), nitro, or halogen moiety,
wherein R³ is alkyl, aryl, alkylaryl, or arylalkyl.

In an alternative (Z) is particularly preferably a hydroxyl moiety

Preferably, the aromatic compound (G11)
comprises per aromatic ring at least two acid groups (Y), or
comprises per aromatic ring at least one acid group (Y) and at least one further functional group (Z) which is different from acid group (Y).

The aromatic compound (G11) comprises at least one, preferably at least two, most preferably 2 to 6, particularly 2 to 4, for example 2 acid groups (Y). The aromatic compound (G11) preferably comprises—per aromatic ring—at least one, more preferably at least two, most preferably 2 to 4, for example 2 acid groups (Y).

In one preferred embodiment, the aromatic compound (G11) comprises at least one benzene ring, and (G11) preferably comprises—per benzene ring—at least one, more preferably at least two, most preferably 2 to 4, for example 2 acid groups (Y).

In a further preferred embodiment, the aromatic compound (G11) comprises at least one benzene ring, and (G11) preferably comprises—per benzene ring—at least one, more preferably at least two, most preferably 2 to 4, for example 2 carboxylic acid (—COOH) groups or their deprotonated form.

In yet a further preferred embodiment, the aromatic compound (G11) is a benzenecarboxylic acid comprising at least one, more preferably at least two, most preferably 2 to 4, for example 2 carboxylic acid (—COOH) groups, or a salt thereof. In yet a further preferred embodiment, the aromatic compound (G11) is a benzenecarboxylic acid comprising at least one, more preferably at least two, most preferably 2 to 4, for example 2 carboxylic acid (—COOH) groups which are directly covalently bound to the benzene ring, or a salt thereof. In yet a further preferred embodiment, the aromatic compound (G11) is most preferably phthalic acid, terephthalic acid, isophthalic acid, 5-hydroxy-isophthalic acid, benzene-1,2,3-tricarboxylic acid, benzene-1,2,3,4-tetracarboxylic acid, or a derivative thereof, or a salt thereof, particularly terephthalic acid, isophthalic acid, 5-hydroxy-isophthalic acid, benzene-1,2,3,4-tetracarboxylic acid, or a derivative thereof, or a salt thereof, for example terephthalic acid, isophthalic acid, or 5-hydroxy-isophthalic acid.

In an alternative the aromatic compound (G11) is particularly 3 hydroxy-benzoic acid or 4-hydroxy-benzoic acid.

The properties of the CMP composition (Q), such as stability and polishing performance, may depend on the pH of the corresponding composition. In general, the CMP composition (Q) can have any pH value. The pH value of the composition (Q) is preferably not more than 14, more preferably not more than 13, most preferably not more than 12, particularly preferably not more than 11.5, particularly most preferably not more than 11, particularly not more than 10.5, for example not more than 10.2. The pH value of the composition (Q) is preferably at least 6, more preferably at least 7, most preferably at least 8, particularly preferably at least 8.5, particularly most preferably at least 9, particularly at least 9.5, for example at least 9.7. The pH value of the composition (Q) is preferably in the range of from 6 to 14, more preferably from 7 to 13, most preferably from 8 to 12, particularly preferably from 8.5 to 11.5, particularly most preferably from 9 to 11, particularly from 9.5 to 10.5, for example from 9.7 to 10.2.

The CMP composition (Q) can further optionally contain at least one pH adjusting agent (H). The pH adjusting agent (H) is different from the components (A), (B), (C), (D) and (M). In general, the pH adjusting agent (H) is a compound which is added to the CMP composition (Q) to have its pH value adjusted to the required value. Preferably, the CMP composition (Q) contains at least one pH adjusting agent (H). Preferred pH adjusting agents are inorganic acids, carboxylic acids, amine bases, alkali hydroxides, ammonium hydroxides, including tetraalkylammonium hydroxides. Particularly, the pH adjusting agent (H) is nitric acid, sulfuric acid, ammonia, sodium hydroxide, or potassium hydroxide. For example, the pH adjusting agent (H) is potassium hydroxide.

If present, the pH adjusting agent (H) can be contained in varying amounts. If present, the amount of (H) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding composition. If present, the amount of (H) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition (Q).

The CMP composition (Q) can further optionally contain at least one biocide (J), for example one biocide. The biocide (J) is different from the components (A), (B), (C), (D) and (M). In general, the biocide is a compound which deters, renders harmless, or exerts a controlling effect on any harmful organism by chemical or biological means. Preferably, (J) is an quaternary ammonium compound, an isothiazolinone-based compound, an N-substituted diazenium dioxide, or an N-hydroxy-diazenium oxide salt. More preferably, (J) is an N-substituted diazenium dioxide, or an N-hydroxy-diazenium oxide salt If present, the biocide (J) can be contained in varying amounts. If present, the amount of (J) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (J) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition (Q).

The CMP composition (Q) may also contain, if necessary, at least one other additive, including but not limited to stabilizers, friction reducing agents, etc. Said other additive is different from the components (A), (B), (C), (D) and (M). Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts. If present, the total amount of said other additives is preferably not more than 10 wt. %, more preferably not more than 2 wt. %, most preferably not more than 0.5 wt. %, particularly not more than 0.1 wt. %, for example not more than 0.01 wt. %, based on the total weight of the corresponding CMP composition. If present, the total amount of said other additives is preferably at least 0.0001 wt. %, more preferably at least 0.001 wt. %, most preferably at least 0.008 wt. %, particularly at least 0.05 wt. %, for example at least 0.3 wt. %, based on the total weight of the corresponding composition (Q).

According to the preferred embodiment (PE1), the composition (Q) comprises
(A) cocoon-shaped silica particles,
(B) an amphiphilic non-ionic surfactant comprising a polyoxyalkylene group,
(C) a carbonate salt,
(D) an alcohol having at least two hydroxyl groups which are not dissociable in the aqueous medium, and
(M) an aqueous medium.

According to the preferred embodiment (PE2), the composition (Q) comprises
(A) cocoon-shaped silica particles,
(B) an amphiphilic non-ionic surfactant comprising a polyoxyalkylene group,
(C) a carbonate salt,
(D) an alcohol,
(E) an oxidizing agent,
(F) a corrosion inhibitor,
(G) a chelating agent, and
(M) an aqueous medium.

According to the preferred embodiment (PE3), the composition (Q) comprises
(A) cocoon-shaped silica particles,
(B) an amphiphilic non-ionic surfactant comprising a polyoxyalkylene group,
(C) an alkali carbonate or an alkali hydrogen carbonate,
(D) an alcohol having at least two hydroxyl groups which are not dissociable in the aqueous medium,
(E) an oxidizing agent,
(F) a corrosion inhibitor,
(G) a chelating agent, and
(M) an aqueous medium.

Processes for preparing CMP compositions are generally known. These processes may be applied to the preparation of the CMP composition (Q). This can be carried out by dispersing or dissolving the above-described components (A), (B), (C), (D) and optionally other components in the aqueous medium (M), preferably water, and optionally by adjusting the pH value through adding an acid, a base, a buffer or an pH adjusting agent. Particularly preferably, the CMP composition (Q) can be prepared by mixing an aqueous dispersion comprising not less than 6 wt. % particles (A), for example cocoon-shaped silica, an aqueous dispersion comprising not less than 1 wt. % non-ionic surfactant (B), 5 wt. % carbonate or hydrogen carbonate salt (C), 5 wt. % alcohol (D) and diluting with de-ionized water. For this purpose, the customary and standard mixing processes and mixing apparatuses such as agitated vessels, high shear impellers, ultrasonic mixers, homogenizer nozzles or counterflow mixers, can be used.

The CMP composition (Q) is preferably prepared by dispersing the cocoon-shaped particles (A), dispersing and/or dissolving the non-ionic surfactant (B), the carbonate or hydrogen carbonate salt (C), the alcohol (D) and optionally other additives in the aqueous medium (M).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition (Q) is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

Figure 2:
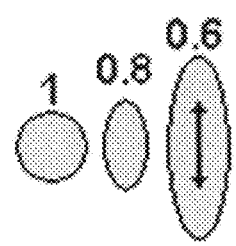

For further details reference is made to WO 2004/063301A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality.

The CMP composition (Q) can be used in the CMP process as ready-to-use slurry, they have a long shelf-life and show a stable particle size distribution over long time. Thus, they are easy to handle and to store. They show an excellent polishing performance, particularly with regard to (a') high MRR of tantalum nitride, (b') low MRR of copper layer, (c') low MRR of low-k or ultra-low-k materials, (d') high selectivity of tantalum nitride over copper with regard to MRR, and (e') high selectivity of tantalum nitride over low-k or ultra-low-k materials with regard to MRR. Furthermore, the CMP composition of the invention shows a longer shelf life, agglomeration within the CMP composition of the invention can be avoided, while high MRR of barrier layer was maintained. Since the amounts of its components are held down to a minimum, the CMP composition (Q) and the CMP process according to the invention can be used or applied in a cost-effective way.

FIG. 1: Schematic illustration of three different values of the shape factor

FIG. 2: Schematic illustration of three different values of the sphericity

FIG. 3: Schematic illustration of the Equivalent Circle Diameter (ECD)

FIG. 4: Energy Filtered-Transmission Electron Microscopy (EF-TEM) (120 kilo volts) image of a dried cocoon-shaped silica particle dispersion with 20 wt. % solid content on a carbon foil

EXAMPLES AND COMPARATIVE EXAMPLES

General Procedure for the CMP Experiments

For the evaluation of the polishing performance on the polisher, the following parameters were chosen:
Polisher: Strasbaugh nSpire (Model 6EC), ViPRR floating retaining ring carrier (hard platen design);
down pressure: 2.0 psi (140 mbar);
back side pressure: 1.5 psi (100 mbar);
retaining ring pressure: 3.0 psi (210 mbar);
polishing table/carrier speed: 112/115 rpm;
slurry flow rate: 200 ml/min;
time main polishing step: 60 s;
pad conditioning: ex situ (2 lbs (=0.907 kg), 8.9 N);
rinse: 10 sec. water
polishing pad: Fujibo H800 NW;
backing film: Strasbaugh, DF200 (136 holes);
conditioning disk: Diamonex CMP 4S830CF6;

The pad is conditioned by two sweeps, before a new type of slurry is used for CMP. The slurry is stirred in the local supply station.

Standard Analysis Procedure for (Semi) Transparent Blanket Wafers:

Removal rate is determined by Filmmetrics F50 reflectometer as mean of differential 49 point diameter scan (5 mm ee) pre and post CMP.

The radial non-unifomity of removal rate is assessed by relative standard deviation of differential 49 point diameter scan pre and post CMP using Filmmetrics F50 (5 mm ee).

Standard consumables for CMP of (semi) transparent coated wafers at
$SiO_2$ films: plasma-enhanced tetraethyl orthosilicate (referred to as "PETEOS" in the following);
Tantalum nitride: CVD;
Low k material: black diamond $1^{st}$ generation (referred to as "BD1" in the following);
Copper: electro plated;

Evaluation of the stock removal rate was carried out by means of a 8 inch (=20.32 cm) blanket wafer. The layer thickness before and after 60 seconds of polishing is measured by a sheet resistance meter (Resmap 273, manufactured by Creative Design Engineering, Inc.).

Dispersion Stability Test:

700 mL slurry were put into an open 2 L beaker and stirred with 300 rpm. pH was monitored as well as the mean particle size before and after the test.
pH: Knick Portamess 911×pH, electrode: Schott instruments Blue Line 28 pH
Calibration: Bernd Kraft GmbH (pH4—Art. Nr. 03083.3000 and pH7—Art. Nr. 03086.3000)
mean particle size: Malvern Instruments GmbH, HPPS 5001

Pot Life Test:

350 g slurry and 14 g $H_2O_2$ (31%) were mixed and stirred for 24 h open to atmosphere; pH before and after this test pH and mean particle size by dynamic light scattering were measured and compared.

Cocoon-Shaped Particles Used in the Examples According to the Invention (A):

Silica particles used as particles (A) are of Fuso PL-3 type. Fuso PL-3 are cocoon-shaped colloidal silica particles having an average primary particle size (d1) of 35 nm and an average secondary particle size (d2) of 70 nm.

TABLE 1

Experimental results of particle shape analysis of cocoon-shaped silica particles (A)

| statistical function | ECD | shericity | shape factor |
|---|---|---|---|
| unit | nm | | |
| number of particles | 475 | 475 | 475 |
| average | 53.67 | 0.631 | 0.881 |
| minimum | 33.68 | 0.150 | 0.513 |
| maximum | 99.78 | 0.997 | 0.978 |
| standard deviation | 11.69 | 0.199 | 0.083 |
| median d50 | 51.32 | 0.662 | 0.911 |
| d90 | | | 0.955 |

(B1) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution. The weight average molecular weight of (B1) is from 900 to 1,500 [g/mol].

Procedure for Particle Shape Characterization

An aqueous cocoon-shaped silica particle dispersion with 20 wt. % solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2k, 16 Bit, 0.6851 nm/pixel (FIG. 4) was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

Procedure for Slurry Preparation:

Preparation of 500 g of the Compositions of the Examples 1 to 2 and of the Comparative Examples V1 and V2:

5.00 g chelating agent (G) are dissolved in 380 g water (M), followed by the slow addition of 3.21 g alcohol (D), 0.50 g nonionic surfactant (B) (10 wt. % aqueous solution) and 12.5 g corrosion inhibitor (F) (1 wt. % aqueous solution). KOH is used to adjust the pH to 10.5. For the examples 1 and 2, 8 g potassium carbonate solution (25 wt. % in aqueous solution) was added prior to the addition of 20.0 g of the abrasive cocoon-shaped particles (A) (20 wt. % aqueous dispersion). Water is added to yield 480 g, pH is adjusted to 10.5 and monitored for 1 h. 20.0 g of oxidizer (E) (31 wt. % aqueous solution) is added prior to polishing, and the pH values as indicated in Table 2 are obtained. The final CMP composition contains the components (A), (B), (C), (D), (E), (F) and optionally (G) or other additives in the amounts as indicated in Table 2.

Examples 1 to 2 (Compositions According to the Invention) and Comparative Examples V1 and V2 (Comparative Composition)

An aqueous dispersion containing the components as listed in Table 2 was prepared, furnishing the CMP compositions of the Examples 1 to 2 and the comparative example V1 and V2.

The formulation and polishing performance data of the CMP compositions of the Example 1 to 2 and of the comparative examples V1 and V2 are indicated in the Table 2:

TABLE 2

CMP compositions of the examples 1 to 2 and of the comparative examples V1 and V2, their pH values, MRR data and dispersion stability data in the process of chemical-mechanical polishing of 8 inch (=20.32 cm) blanket wafers using these compositions, wherein the aqueous medium (M) of the CMP compositions is de-ionized water. The amounts of the components (A), (B), (C), (D), (E), (F) and (G) are specified in weight percent (wt. %) by weight of the corresponding CMP composition. If the amounts of the components other than (M) are in total y % by weight of the CMP composition, then the amount of (M) is (100 − y) % by weight of the CMP composition. The pH of the compositions was adjusted using potassium hydroxide.

| | Comparative Example V1 | Comparative Example V2 | Example 1 | Example 2 |
|---|---|---|---|---|
| Cocoon-shaped particles (A) | Fuso PL-3 silica 2 wt. % | Fuso PL-3 silica 2 wt. % | Fuso PL-3 silica 2 wt. % | Fuso PL-3 silica 2 wt. % |
| Non-ionic surfactant (B) | (B1) 0.01 wt. % | (B1) 0.01 wt. % | (B1) 0.01 wt. % | (B1) 0.01 wt. % |
| Carbonate or hydrogen carbonate salt (C) | — | — | Potassium carbonate 0.5 wt. % | Potassium carbonate 0.5 wt. % |
| Alcohol (D) | Propane-1,2-diol 0.65 wt. % | Propane-1,2-diol 0.65 wt. % | Propane-1,2-diol 0.65 wt. % | Propane-1,2-diol 0.65 wt. % |
| Oxidizing agent (E) | $H_2O_2$ 1.24 wt. % | $H_2O_2$ 1.24 wt. % | $H_2O_2$ 1.24 wt. % | $H_2O_2$ 1.24 wt. % |
| Corrosion inhibitor (F) | Benzotriazole 0.05 wt. % | Benzotriazole 0.05 wt. % | Benzotriazole 0.05 wt. % | Benzotriazole 0.05 wt. % |
| Chelating agent (G) | Malonic Acid 1 wt. % | Terephthalic acid 1 wt. % | Malonic Acid 1 wt. % | Terephthalic acid 1 wt. % |
| pH | 9.8 | 9.7 | 10.0 | 9.9 |
| PETEOS-MRR in Å/min | 446 | 380 | 517 | 456 |
| Tantalum nitride MRR in Å/min | 788 | 736 | 793 | 810 |

TABLE 2-continued

CMP compositions of the examples 1 to 2 and of the comparative examples V1 and V2, their pH values, MRR data and dispersion stability data in the process of chemical-mechanical polishing of 8 inch (=20.32 cm) blanket wafers using these compositions, wherein the aqueous medium (M) of the CMP compositions is de-ionized water. The amounts of the components (A), (B), (C), (D), (E), (F) and (G) are specified in weight percent (wt. %) by weight of the corresponding CMP composition. If the amounts of the components other than (M) are in total y % by weight of the CMP composition, then the amount of (M) is (100 − y) % by weight of the CMP composition. The pH of the compositions was adjusted using potassium hydroxide.

|  | Comparative Example V1 | Comparative Example V2 | Example 1 | Example 2 |
|---|---|---|---|---|
| Copper MRR in Å/min | 103 | 74 | 282 | 296 |
| BD1 MRR in Å/min | 88 | 73 | 164 | 193 |
| Dispersion stability test (pot life test) | Phase seperation | Phase seperation | Stable | Stable |
| Mean particle size (nm) | 67 | 67 | 67 | 67 |
| pH | 9.8 | 9.7 | 10.0 | 9.9 |
| pH after 7 h stirring* | 9.3 | 9.4 | 9.8 | 9.8 |
| pH drift after 7 h stirring* | 0.5 | 0.3 | 0.2 | 0.1 |
| pH after 24 h stirring* | 9.0 | 9.0 | 9.6 | 9.6 |
| pH drift after 24 h stirring* | 0.8 | 0.7 | 0.4 | 0.3 |
| Mean particle size (nm) after 24 h* | 73 | 70 | 67 | 67 |
| Observation after 24 h* | Phase separation | Phase separation | Stable, no phase separation | Stable, no phase separation |

(*= data from the dispersion stability test)

The CMP compositions of the Examples 1 to 2 show an improved polishing performance and improved pot life, particularly shows high MRR of tantalum nitride, high selectivity of tantalum nitride over copper with regard to MRR, and high selectivity of tantalum nitride over black diamond 1$^{st}$ generation material with regard to MRR.

The invention claimed is:

1. A chemical mechanical polishing (CMP) composition, comprising:
    inorganic particles, organic particles, or a mixture or composite thereof, wherein the particles are cocoon-shaped;
    a non-ionic surfactant;
    a carbonate or hydrogen carbonate salt;
    an alcohol; and
    an aqueous medium.

2. The CMP composition according to claim 1,
    wherein the alcohol is an alcohol having at least two hydroxyl groups which are not dissociable in the aqueous medium.

3. The CMP composition according to claim 1, further comprising:
    an oxidizing agent.

4. The CMP composition according to claim 1, further comprising:
    a corrosion inhibitor.

5. The CMP composition according to claim 1, further comprising:
    a chelating agent.

6. The CMP composition according to claim 1,
    wherein the particles are cocoon-shaped silica particles.

7. The CMP composition according to claim 1,
    wherein the non-ionic surfactant is an amphiphilic non-ionic surfactant comprising a polyoxyalkylene group.

8. The CMP composition according to claim 1,
    wherein the carbonate salt is an alkali carbonate or an alkali hydrogen carbonate.

9. The CMP composition according to claim 1, further comprising:
    an inorganic or organic acid as chelating agent.

10. The CMP composition according to claim 1,
    wherein a pH value of the CMP composition is from 8 to 12.

11. The CMP composition according to claim 1, comprising:
    cocoon-shaped silica particles;
    an amphiphilic non-ionic surfactant comprising a polyoxyalkylene group;
    an alkali carbonate or an alkali hydrogen carbonate;
    an alcohol having at least two hydroxyl groups which are not dissociable in
    an aqueous medium;
    an oxidizing agent;
    a corrosion inhibitor;
    a chelating agent; and
    an aqueous medium.

12. A process for manufacturing a semiconductor device, comprising:
    chemical mechanical polishing a substrate used in the semiconductor industry in presence of the CMP composition according to claim 1.

13. A method, comprising chemical mechanical polishing a substrate used in the semiconductor industry, the method employing the CMP composition according to claim 1.

14. The method according to claim 13,
    wherein the substrate comprises:
    (i) copper,
    (ii) tantalum, tantalum nitride, titanium, titanium nitride, ruthenium, cobalt, or alloys thereof,
    or both (i) and (ii).

* * * * *